US010268165B2

(12) United States Patent
Schwartz et al.

(10) Patent No.: US 10,268,165 B2
(45) Date of Patent: Apr. 23, 2019

(54) ELECTRICAL DETECTOR FOR LIQUID METAL LEAKS

(71) Applicant: The Trustees of Princeton University, Princeton, NJ (US)

(72) Inventors: Jacob Schwartz, Princeton, NJ (US); Michael Jaworski, Lawrenceville, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 635 days.

(21) Appl. No.: 14/933,678

(22) Filed: Nov. 5, 2015

(65) Prior Publication Data

US 2016/0123833 A1 May 5, 2016

Related U.S. Application Data

(60) Provisional application No. 62/075,353, filed on Nov. 5, 2014.

(51) Int. Cl.
| | |
|---|---|
| *G01M 3/18* | (2006.01) |
| *G01M 3/40* | (2006.01) |
| *G05B 9/00* | (2006.01) |
| *G05B 9/02* | (2006.01) |
| *G05B 9/05* | (2006.01) |
| *G01R 31/392* | (2019.01) |

(52) U.S. Cl.
CPC ............ *G05B 9/02* (2013.01); *G01M 3/18* (2013.01); *G01M 3/40* (2013.01); *G01R 31/392* (2019.01); *G05B 9/00* (2013.01); *G05B 9/05* (2013.01)

(58) Field of Classification Search
CPC .. G05B 9/02; G05B 9/05; G01M 3/18–3/186; G01M 3/40
See application file for complete search history.

(56) References Cited

U.S. PATENT DOCUMENTS 4,332,170 A * 6/1982 Belval ................. G21C 17/002
340/605

OTHER PUBLICATIONS

Furukawa, T. et al. "Safety Concept of the IFMIF/EVEDA Lithium Test Loop", Fusion Engineering and Design 86, pp. 2433-2436, (2011).

(Continued)

*Primary Examiner* — Paul M. West
(74) *Attorney, Agent, or Firm* — Meagher Emanuel Laks Goldberg & Liao, LLP

(57) ABSTRACT

A liquid metal leak detector system including a direct current (DC) power supply and a plurality of analog to digital converters connected to the DC power supply. Each converter includes a liquid metal switch, where the liquid metal switch is closed in event of a liquid metal leak since the liquid metal leak causes electrical continuity between a conductive sheeting and a housing for liquid metal. The converter also includes a comparator connected to both the liquid metal switch for converting an analog signal into a digital signal, wherein the digital signal is configured such that a high signal constitutes no leak and a low signal constitutes a leak. An AND gate is also connected to each of the plurality of converters for combining all of the digital signals output from the converters, the AND gate configured such that the AND gate outputs a high signal if all of its inputs are high and a low signal if any input is low.

27 Claims, 8 Drawing Sheets

(56) References Cited

OTHER PUBLICATIONS

Reed, C. et al. "The Conversion of a Room Temperature NaK Loop to a High Temperature MHD Facility for Li/V Blanket Testing." Proceedings of the 12th Topical Meeting on the Technology of Fusion Energy, Argonne National Laborotory, (Jun. 1996).
Leonard, J., "Use of Copper Powder Extinguishers of Lithium Fires", Naval Research Laboratory, Technical Report NRL/MR/6180-94-7490, (Jul. 1994).
Kim, H. et al. "Liquid Metal Batteries: Past, Present and Future", Chemical Reviews, vol. 113, pp. 2075-2099, (Nov. 27, 2012).
Schwartz, J. et al. "Safety and Diagnostic Systems on the Liquid Lithium Test Stand" High Temperature Plasma Diagnostics Conference, Atlanta GA, (Jun. 5, 2014).
Schwartz, J. et al "Electrical Detection of Liquid Lithium Leaks from Pipe Joints", Review of Scientific Instruments 85, vol. 11E824 (2014).
Schwartz, J. et al. "Electrical Detection of Liquid Lithium Leaks from Pipes" APS Division of Plasma of Plasma Physics Conference, Denver CO, (Nov. 13, 2013).

\* cited by examiner

ELECTRICAL DETECTOR FOR LIQUID METAL LEAKS

CROSS-REFERENCE TO RELATED APPLICATIONS

This application claims priority to provisional application No. 62/075,353, filed on Nov. 5, 2014, which is herein incorporated by reference.

STATEMENT REGARDING FEDERALLY SPONSORED RESEARCH OR DEVELOPMENT

This invention was made with government support under Grant # DE-AC02-09CH11466 awarded by the Department of Energy. The government has certain rights in the invention.

FIELD OF THE INVENTION

Embodiments of the present invention relate generally to electrical detectors for leaks, and more particularly, to utilizing the conductivity of liquid metal to complete an electrical circuit when the liquid metal leaks.

BACKGROUND OF THE INVENTION

Liquid metal has unique physical properties useful for many applications. For instance, liquid lithium is a candidate material in a plasma facing component (PFC) for a fusion reactor. Liquid lithium also has a potential use as a diverter wall in fusion reactors, where lithium must be in a liquid phase to continually be renewed at the diverter surface to prevent buildup of impurities. Liquid lithium, liquid antimony alloys, and liquid gallium electrodes can also be utilized in liquid metal batteries and high-power electrical switches.

However, liquid lithium and other liquid metals pose a number of serious safety concerns. Notably, liquid lithium is extremely reactive with materials such as water and, to a certain extent, air. Thus, using liquid lithium or other dangerous liquid metals in a system, such as a pumping system, would require isolating the liquid metal from the surroundings with the use of either an argon atmosphere or a vacuum. One means of insuring safety when using liquid metal systems is by welding all connections, eliminating the need for joints or valves and the risk of leaks. However, these designs sacrifice flexibility because any modifications to the system must be done with a welding torch.

Alternatively, joints or valves can be used to connect segments of the liquid metal systems together, but this creates potential leak risks at each connection. With sensitive components nearby the connections, significant and costly damage could result from a liquid metal leak if not properly attended to and handled.

Thus, there is a need for a leak detector that can both detect a leak and create a feedback mechanism that will minimize associated risks.

SUMMARY OF THE INVENTION

According to some embodiments, a liquid metal leak detector system is provided. The liquid metal leak detector system includes a direct current (DC) power supply and a plurality of analog to digital converters connected to the DC power supply. Each analog to digital converter includes a liquid metal switch, where the liquid metal switch is closed in event of a liquid metal leak since the leak causes electrical continuity between conductive sheeting and housing for the liquid metal. Each analog to digital converter also includes a comparator connected to both the liquid metal switch for converting an analog signal into a digital signal, where the digital signal is configured such that a high signal constitutes no leak and a low signal constitutes a leak. The system also includes an AND gate connected to each of the plurality of converters for combining all of the digital signals output from the converters, the AND gate configured such that the AND gate outputs a high signal if all of its inputs are high and a low signal if any input is low.

According to some embodiments, a circulation system for liquid metal is provided. The circulation system includes a plurality of valve and/or joint connections, each connection constructed to connect two or more pipe segments of the circulation system, where liquid metal passes through the pipe segments. The system also includes an insulator layer around each connection of the plurality of connections, and conductive sheeting around each insulator layer. The system additionally includes a leak detector circuit attached to each connection via the conductive sheeting. The leak detector circuit includes a direct current (DC) power supply and an analog to digital converter connected to the DC power supply, which includes a liquid metal switch, where the liquid metal switch is closed when there is a liquid metal leak since the leak causes electrical continuity between the conductive sheeting and the connection, and a comparator connected to the liquid metal switch for converting an analog signal into a digital signal, where the digital signal is configured such that a high signal constitutes no leak and a low signal constitutes a leak. The system also includes an AND gate connected to each of the plurality of leak detector circuits for combining all of the digital signals output from the converters, the AND gate configured such that the AND gate outputs a high signal if all of its inputs are high and a low signal if any input is low. The system further includes a mechanical relay configured to receive a high or low signal from the AND gate, wherein receiving a low signal indicates to open a switch, which shuts off portions of the system including liquid metal heaters and the liquid metal pump, cooling the liquid metal and relieving pressure.

According to some embodiments, a leak detector system for liquid metal batteries is provided. The system includes a liquid metal battery. The liquid metal battery includes a positive electrode, a negative electrode, and an electrolyte, where at least one electrode includes a liquid metal. The liquid metal battery also includes a battery housing to enclose the electrodes and electrolyte, an insulator layer around the battery housing, and conductive sheeting around the insulator layer. The system further includes a leak detector circuit attached to the conductive sheeting. The circuit includes a direct current (DC) power supply and an analog to digital converter connected to the DC power supply. The analog to digital converter includes a liquid metal switch, where the liquid metal switch is closed when there is a liquid metal leak since the leak causes electrical continuity between the conductive sheeting and battery housing, and a comparator connected to the liquid metal switch for converting an analog signal into a digital signal, where the digital signal is configured such that a high signal constitutes no leak and a low signal constitutes a leak.

According to some embodiments, a leak detector system for liquid metal batteries for the detection of internal leaks is provided. The system includes a liquid metal battery. The liquid metal battery includes a positive electrode, a negative electrode, and an electrolyte, where at least one electrode includes a liquid metal. The liquid metal battery also includes a battery housing to enclose the electrodes and electrolyte, an insulator layer surrounding the negative electrode and a second insulating layer separating a conductive sheet from the battery electrodes. The system further includes a leak detector circuit attached to the conductive sheeting. The circuit includes a direct current (DC) power supply and an analog to digital converter connected to the DC power supply. The analog to digital converter includes a liquid metal switch, where the liquid metal switch is closed when there is a liquid metal leak since the leak causes electrical continuity between the conductive sheeting and battery housing, and a comparator connected to the liquid metal switch for converting an analog signal into a digital signal, where the digital signal is configured such that a high signal constitutes no leak and a low signal constitutes a leak.

According to some embodiments, a leak detector system for high power switches is provided. The system includes a high power switch, which includes two electrodes and a control grid between the electrodes. The high power switch further includes liquid metal surrounding at least one of the electrodes. The high power switch also includes a power switch housing to enclose the electrodes and control grid, an insulator layer around the power switch housing, and a conductive sheeting around the insulator layer. The system further includes a leak detector circuit attached to the conductive sheeting. The leak detector circuit includes a direct current (DC) power supply and an analog to digital converter connected to the DC power supply. The analog to digital converter includes a liquid metal switch, where the liquid metal switch is closed in event of a leak since the leak causes electrical continuity between the conductive sheeting and the electrode surrounded by liquid metal, and a comparator connected to the liquid metal switch for converting an analog signal into a digital signal, where the digital signal is configured such that a high signal constitutes no leak and a low signal constitutes a leak.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. It is noted that the drawings of the invention are not to scale. The drawings are mere schematics representations, not intended to portray specific parameters of the invention. Understanding that these drawings depict only typical embodiments of the invention and are not, therefore, to be considered to be limiting its scope, the invention will be described and explained with additional specificity and detail through the use of the accompanying drawings, in which.

Figure 1:
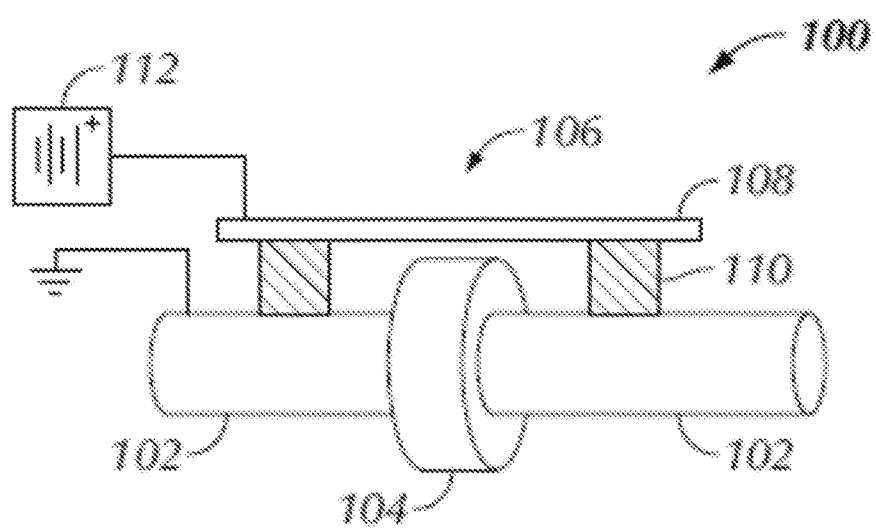
FIG. 1 is a physical diagram of a portion of a circulation system with a leak detector according to an embodiment of the present invention.

In the drawings, elements having the same designation have the same or similar functions.

DETAILED DESCRIPTION OF THE INVENTION

For the purposes of promoting an understanding of the principles of the invention, reference will now be made to the exemplary embodiments illustrated in the drawings, and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Reference throughout this specification to an "embodiment," an "example" or similar language means that a particular feature, structure, characteristic, or combinations thereof described in connection with the embodiment is included in at least one embodiment of the present invention. Thus, appearances of the phrases an "embodiment," an "example," and similar language throughout this specification may, but do not necessarily, all refer to the same embodiment, to different embodiments, or to one or more of the figures. Additionally, reference to the wording "embodiment," "example" or the like, for two or more features, elements, etc. does not mean that the features are necessarily related, dissimilar, the same, etc.

FIG. 1 illustrates a diagram of a portion of a circulation system with a leak detector according to an embodiment of the present invention. The system 100 includes two pipe segments 102 connected by a pipe joint or valve connection 104. In some embodiments, the pipe segments 102 are stainless steel; however, other materials may be used so long as those materials do not chemically interact with the liquid metal inside. For instance, the pipe segments 102 may also be molybdenum or tungsten. The circulation system 100 also includes reservoirs, a preheater, and an electromagnetic pump (not shown) to store and move the liquid metal through the circulation system 100. Assuming proper construction of the piping, the risk of major leaks will occur at the connection 104. Thus, a leak detector 106 will be attached to connection 104, such that the detector will be compatible with lithium, gallium, or any other liquid metals moving through the circulation system 100. The leak detector 106 will also be small enough to localize at each connection 104. The detection of a leak will be accomplished using the conductivity of liquid metals so that in the case of a leak, the liquid metal will complete a circuit and allow current to flow.

The leak detector 106 includes a conductive sheet 108 placed over each connection 104. In some embodiments, the conductive sheet 108 will be copper though other conductive materials may be used such as tungsten. However, copper is preferred for use with liquid lithium as it is cheaper and has the benefit of alloying with liquid lithium, which reduces reactivity of the liquid lithium with surrounding air and moisture. Further, the higher thermal conductivity of copper could draw heat away from the liquid metal, which also reduces reactivity. Alternatively, the conductive sheet 108 may be a thicker shell for better prevention of liquid metal leaks. The conductive sheet 108 is placed over each connection 104 and separated from the pipe segments 102 by two insulator rings 110. The insulator rings may be ceramic, plastic, or vinyl electrical tape, though other insulation materials may also be used. Each insulator ring 110 is connected to each segment of pipe 102. The conductive sheet 108 is placed at an electric potential greater than the pipe segment 102 through a power supply 112. In some embodiments, the potential difference is 5 volts (based on a 5 V DC power supply), though other potential differences may also be utilized such as but not limited to 12 volts or 15 volts (based on 12 V or 15 V DC power supplies respectively). Negative potentials could be utilized as well. A 5 volt potential difference is preferred due to its low voltage which insures accidental contact with any of the wiring will not lead to injury and low power dissipation reduces the risk of circuit components failing; however, any range of potential difference could be used so long as the potential is high enough to reliably detect without being subject to noise and low enough to not cause arcing. In the case of a leak, the liquid metal leaking from the connection 104 will close a circuit between the pipe segment 102 and conductive sheet 108, allowing current to flow. This serves as an input signal for the remainder of the circuit, discussed in greater detail below.

For embodiments utilizing liquid lithium, the electrical resistivity of lithium at its melting point has been measured as about 25 $\mu\Omega$*cm. Therefore, if the cross sectional area of the pipe segments 102 is on the order of 10 cm$^2$ and the spacing between the conductive sheet 108 and pipe segment 102 is 1 cm, the resistance of the liquid lithium will be approximately 25×$\frac{1}{10}$=2.5 $\mu$m, which effectively shorts the conductive sheet 108 to the pipe segment 102.

Figure 2:
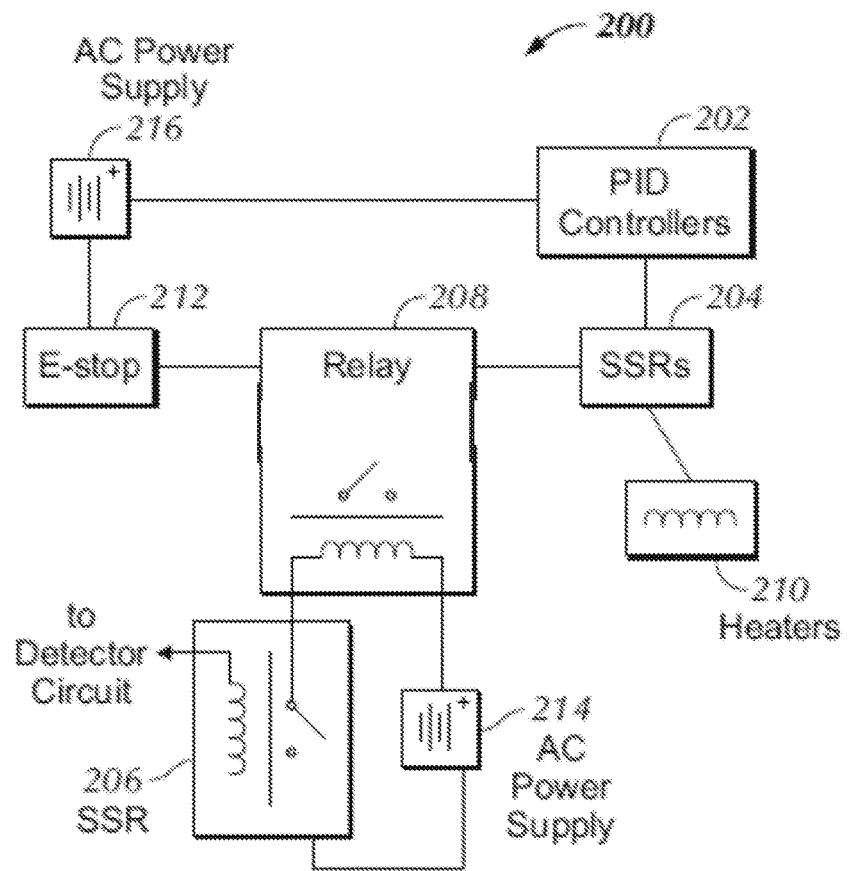
FIG. 2 is a schematic diagram of a circulation system with a leak detector according to an embodiment of the present invention.

FIG. 2 is a schematic diagram of a circulation system 200 with a leak detector according to an embodiment of the present invention, where the leak detector controls a corresponding heater circuit in order to shut off heaters in the event of a leak. While lithium or other liquid metals can be extremely reactive in their liquid phase, once solidified, they react much less rapidly in atmospheric conditions and will not spontaneously burn at room temperature in dry air. Thus, potential risks of a liquid metal fire can be contained by connecting the leak detector to a heater system 210. In the case of a liquid metal leak, the heater system 210 will shut off heaters so that the liquid metal solidifies. Thus, risks of splashing and further leakage will be prevented. Additional system elements, such as liquid metal pumps (not shown), can be simultaneously de-energized with the same circuit as well.

Proportional integral derivative (PID) controllers 202 and solid state relays (SSRs) 204 allow for a feedback mechanism to set the temperature of the liquid metal at some predetermined set point. In the case of a leak, the leak detector 200 will switch a SSR 206, which will in turn switch a mechanical relay 208, thereby breaking the circuit which powers the liquid metal heater system 210. A manual shut-off (E-stop) 212 is also included in event the liquid metal heaters 210 must be powered down manually, possibly because the heaters 210 must be shut down for a reason unrelated to liquid metal leakage or if there is a malfunction in the mechanical relay 208. A key advantage in the leak detector circuit 200 is utilizing the same power supply 214 for the circuit 200 and the heaters 210. This insures that liquid metal cannot pass through pipe segments without a powered leak detector. In one embodiment, the power supply 214 is a 120 V AC power supply, though in other embodiments other power supplies may be utilized such as but not limited to 240 V AC. An additional power supply 216 is also connected between the manual shut-off 212 and PID controllers 202 for providing power in the event a manual shutdown is required.

In an alternative embodiment, the SSR 206 could be connected directly to the heater circuit 210, cutting out the intermediary mechanical relay 208 in order to simplify the circuit. However, preferred embodiments include the mechanical relay 208 because of its high dependability and ability to withstand transient currents, resulting in a more robust leak detector circuit. Furthermore, mechanical relays are cheaper to replace and able to handle higher power loads than SSRs.

Figure 3:
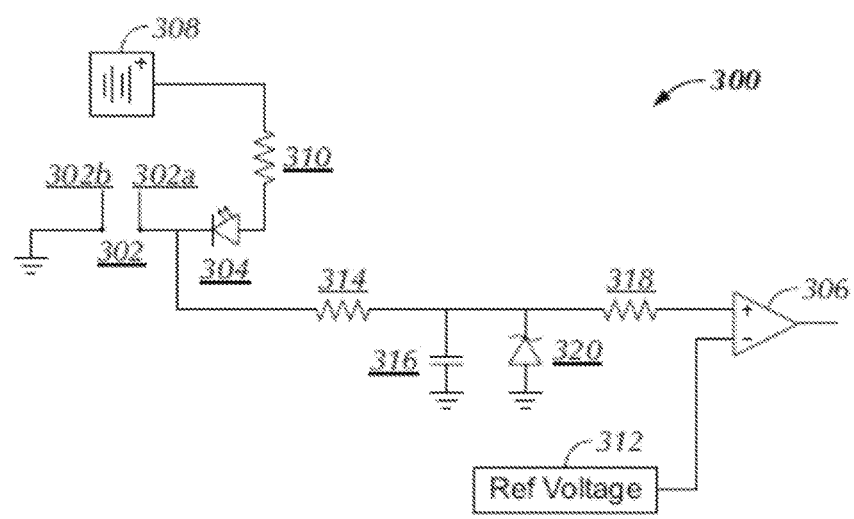
FIG. 3 is a schematic diagram of an analog to digital converter for a leak detector according to an embodiment of the present invention.

FIG. 3 is a schematic diagram of an analog to digital converter circuit 300 for a leak detector according to an embodiment of the present invention. The leak detector requires digital output (either high or low) in order to function properly, allowing the leak detector to differentiate between a leak and a mere fluctuation in the resistivity of air. Further, the leak detector must respond equally to a large or small leak, considering the danger of even a small liquid metal leak. While the embodiment discussed below may utilize a high signal to signify no leaks and a low signal to signify a leak, other embodiments may reverse the signals such that a low signal means no leaks and a high signal means a leak without limiting the scope of the invention.

The digital converter circuit 300 includes a DC power supply 308. In a preferred embodiment, the power supply is a 5 V DC unipolar source, though other power supplies may be utilized in other embodiments such as but not limited to 12 volts or 15 volts, or negative potentials. A 5 V DC unipolar power supply is preferred due to its low voltage which insures accidental contact with any of the wiring will not lead to injury and low power dissipation reduces the risk of circuit components failing. The power supply 308 is preferred to be unipolar because they are easier to find and cheaper, as well as exhibiting easier interfacing with integrated circuit components, particularly comparators.

In event of a liquid metal leak, a liquid metal switch 302 will be closed, due to electrical continuity between the connection housing the liquid metal and the conductive sheet, effectively shorting the end of a light emitting diode (LED) 304 to ground. This is due to one input 302a of the liquid metal switch 302 being attached to the conductive sheet, and the other input 302b of the liquid metal switch 302 being attached to the connection housing the liquid metal. In one embodiment, the LED 304 is red, though other colors may be used. Further, the LED 304 may have a panel mount footprint which allows multiple LEDs from separate detectors to be combined in one panel to facilitate the determination of where a leak occurs. Since the same current that flows through the circuit 300 closed by the leak is also lighting the LED 304, there is greater assurance that a leak is occurring when the LED lights up, as opposed to a possible problem elsewhere in the circuit. Alternatively, or additionally, other components aside from the LED 304 may be included to indicate that a leak is occurring. For instance, a speaker (not shown) could sound an alarm when the liquid metal switch 302 is closed, alerting that a leak is occurring. The digital converter circuit 300 additionally includes a resistor 310. The resistor 310 is used as a current limiter to prevent the LED 304 from failing and has a resistance of about 150Ω in one embodiment, though the resistance could vary as appropriate to the voltage chosen for the system and type of LED 304.

The digital converter circuit 300 also includes a comparator 306, which will output a potential V volts if the potential at the low end of the LED 304 is greater than V/2 volts and will output a potential 0 volts if it is less than V/2 volts. V denotes the voltage of the DC power supply 308, which is typically but not limited to 5 volts. Thus, the analog to digital converter circuit 300 will turn on the LED 304 to indicate a leak, and further will output a potential 0 volts if a leak and potential V volts if no leak. In one embodiment, the comparator 306 is a standard part LM239N comparator though other comparators may also be utilized. The LM239N comparator has the benefit of handling up to 36 volts of differential input voltage, which provides a good margin of error in case of overload. The LM239N comparator also uses an open-drain output, enabling the combination of multiple comparators on one chip, which minimizes space on a circuit board.

The comparator 306 includes a reference voltage input 312. Increasing the reference voltage for the comparator 306 from V/2 volts to a value near V volts can enhance sensitivity, but this may depend on the measured variation of the resistance of the liquid metal. For instance, if the resistance of the liquid metal were higher than predicted, even a small decrease in the potential at the low end of the LED 304 should signify a leak. In one embodiment, the leak detector will only turn on if the potential at the low end of the LED 304 falls below V/2 volts. Alternatively, a potentiometer could be used to find the largest reference voltage for the circuit 300 that does not cause any false leak detection in order to ensure maximum sensitivity. In either case, the reference voltage may be chosen as appropriate to the system being monitored.

Included between the liquid metal switch 302 and comparator 306 are a resistor 314 and capacitor 316 to ground. The resistor 314 and capacitor 316 act as a RC low pass filter in order to prevent electrical noise from falsely identifying a leak. In one embodiment, the low pass filter is 1 kHz, though other frequencies may be used so long as there is a fast enough time constant such that the circuit 300 can allow for preventative measures before the liquid metal leaks significantly, but should not be small enough so that electrical noise is an issue. Also included between the liquid metal switch 302 and comparator 306 are a resistor 318 and Zener diode 320. These two components protect the comparator 306 against unexpected high currents. In one embodiment, the resistor 318 has a resistance of about 10 kΩ, though the resistance can range from about 100Ω to 50 kΩ.

While an embodiment of the leak detector circuit may be entirely analog, a digital circuit is preferred for the following reasons. The digital circuit is better able to handle multiple leaks because of its inherent current limiting design and its use of a high/low signal to demonstrate a leak (rather than a varying analog signal). Furthermore, the digital circuit is more easily interfaced with further circuitry because of the digital nature of its output. Moreover, the use of the comparator 306 renders the digital circuit more robust in the event of mild fluctuations of the input voltage as well as insuring a constant current through the LED 304 in the case of a leak.

Figure 4:
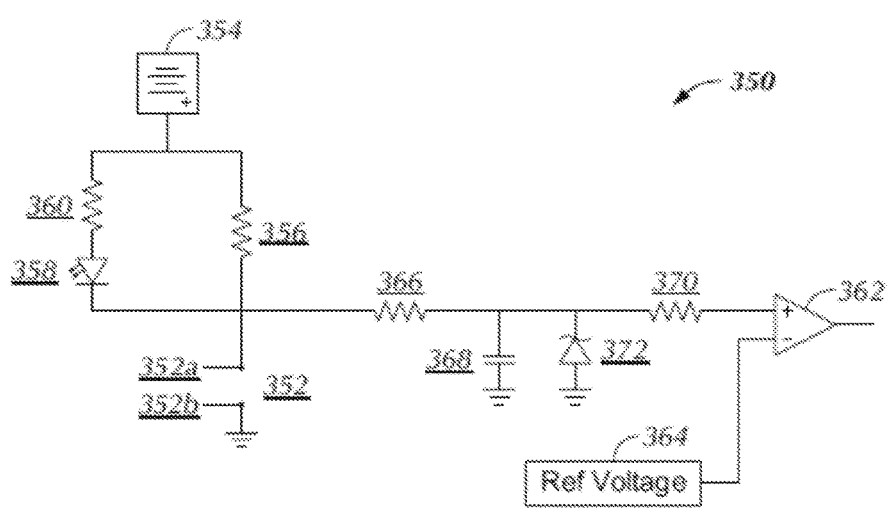
FIG. 4 is a schematic diagram of an alternative analog to digital converter for a leak detector according to an embodiment of the present invention.

FIG. 4 is a schematic diagram of an alternative analog to digital converter circuit 350 for a leak detector according to an embodiment of the present invention. While the embodiment discussed below may utilize a high signal to signify no leaks and a low signal to signify a leak, other embodiments may reverse the signals such that a low signal means no leaks and a high signal means a leak without limiting the scope of the invention.

The digital converter circuit 350 includes a liquid metal switch 352. In event of a liquid metal leak, the liquid metal switch 352 will be closed, due to electrical continuity between the connection housing the liquid metal and the conductive sheet. This is due to one input 352a of the liquid metal switch 352 being attached to the conductive sheet, and the other input 352b of the liquid metal switch 352 being attached to the connection housing the liquid metal (as well as ground).

The liquid metal switch 352 is coupled to a DC power supply 354 in series with a pull-up resistor 356. In a preferred embodiment, the power supply is a 5 V DC unipolar source, though other power supplies may be utilized in other embodiments such as but not limited to 12 volts or 15 volts. A 5 V DC unipolar power supply is preferred due to its low voltage which insures accidental contact with any of the wiring will not lead to injury and low power dissipation reduces the risk of circuit components failing. The power supply 354 is preferred to be unipolar because they are easier to find and cheaper, as well as exhibiting easier interfacing with integrated circuit components, particularly comparators.

The pull-up resistor 356 is used in relation to a comparator 362. During normal operation (i.e. no leaks have occurred), the positive input of the comparator 362 is pulled up above a comparator reference voltage 364 included at the negative input of the comparator 362 by the pull-up resistor 356. The pull-up resistor 356 typically has a resistance of 100 kΩ, though the resistance may range from about 10Ω to 500 kΩ. If a leak has occurred, current flows from the first input 352a of the liquid metal switch 352 to ground, and the positive input of the comparator 362 is pulled below the reference voltage 364. Thus, the comparator 362 will output a potential V volts (high signal) if the potential is above the reference voltage 364, indicating no leaks have occurred, and will output a potential of approximately 0 volts (low signal) if it is less than the reference voltage 364, indicating a leak occurred. V denotes the voltage of the DC power supply 354, which is typically but not limited to 5 volts. In one embodiment, the comparator 362 is a standard part TI TLC3704 comparator, though other comparators may also be utilized. The TLC3704 comparator is preferred for its push-pull output to better ensure the correct voltage at the comparator output when outputting a low signal.

Increasing the reference voltage 364 for the comparator 362 from V/2 volts to a value near V volts can enhance sensitivity, but this may depend on the measured variation of the resistance of the liquid metal. For instance, if the resistance of the liquid metal were higher than predicted, even a small decrease in potential should signify a leak. In one embodiment, the leak detector will only turn on if the potential falls below V/2 volts. Alternatively, in a preferred embodiment, a potentiometer could be used to find the largest reference voltage for the circuit 350 that does not cause any false leak detection in order to ensure maximum sensitivity. In either case, the reference voltage 364 will be chosen as appropriate to the system being monitored.

The liquid metal switch 352 is also coupled to a light emitting diode (LED) 358 in series with a resistor 360. In one embodiment, the LED 358 is red, though other colors may be used. Further, the LED 358 may have a panel mount footprint which allows multiple LEDs from separate detectors to be combined in one panel to facilitate the determination of where a leak occurs. Since the same current that flows through the circuit 350 closed by the leak is also lighting the LED 358, the magnitude of the leak may be dependent on the brightness of the LED, thus allowing appropriate safety measures to be taken depending on the significance of the liquid metal leak. Alternatively, or additionally, other components aside from the LED 358 may be included to indicate that a leak is occurring. For instance, a speaker (not shown) could sound an alarm when the liquid metal switch 352 is closed, alerting that a leak is occurring. The resistor 360 is used as a current limiter to prevent the LED 358 from failing and has a resistance of about 220Ω in one embodiment, though the resistance could range from about 50 to 500Ω.

Included between the liquid metal switch 352 and comparator 362 are a resistor 366 and capacitor 368 to ground. The resistor 366 and capacitor 368 act as a RC low pass filter in order to prevent electrical noise from falsely identifying a leak. In one embodiment, the low pass filter is 1 kHz, though other frequencies may be used so long as there is a fast enough time constant such that the circuit 350 can allow for preventative measures before the liquid metal leaks significantly, but should not be small enough so that electrical noise is an issue. Also included between the liquid metal switch 352 and comparator 362 are a resistor 370 and Zener diode 372. These two components protect the comparator 362 against unexpected high currents. In one embodiment, the resistor 370 has a resistance of about 10 kΩ, though the resistance can range from about 100Ω to 50 Ω.

Figure 5:
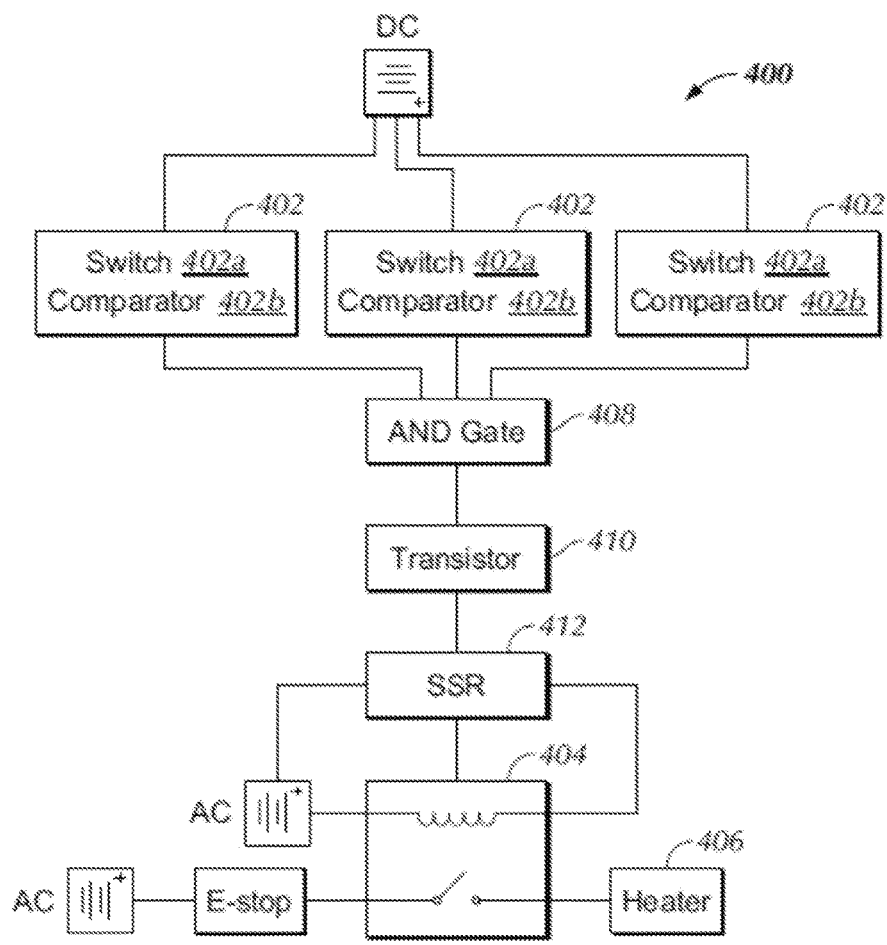
FIG. 5 is a schematic diagram of a circulation system with multiple leak detectors according to an embodiment of the present invention.

FIG. 5 is a schematic diagram of a circulation system 400 with multiple leak detectors according to an embodiment of the present invention. A typical embodiment combines the digital signals from multiple leak detectors 402, each of which includes at least a liquid metal switch 402a and comparator 402b. The multiple leak detectors can use the analog to digital converters described FIG. 3 or 4, or a combination of the two. While FIG. 5 shows three leak detectors 402, any number of leak detectors may be included in the system 400. The digital signals are combined before switching a mechanical relay 404 to control one or more heaters 406. The mechanical relay 404 will switch if there is a leak at any of the multiple leak detectors 402, i.e. if any of the outputs is low (or approximately 0 volts). Thus, the circulation system 400 requires an AND gate 408 which will output a high signal if all of its inputs are high and a low signal is any input is low. In one embodiment, the AND gate 408 is a CD4082B AND gate, which combines two four-input AND gates on one chip. However, other standard AND gate types may be utilized as well; for instance, the AND gate could be 2-input or 3-input, use TTL logic or CMOS, respond quickly, or output higher currents. The CD4082B AND gate is preferred because it minimizes space need on a circuit board and reduces the number of successive AND gates needed to combine the signals from numerous leak detectors, since the CD4082B AND gate has four inputs.

The circulation system 400 also includes a transistor 410 placed between the AND gate 408 and an SSR 412. The transistor 410 will amplify the current of the signal so that it can drive the SSR 412 and mechanical relay 404. Most standard transistor types may be utilized, so long as they can allow a current of up to 10 mA needed to drive the SSR 412, though preferably the transistor 410 will allow a current of up to 100 mA to flow at the output. Furthermore, most standard SSRs may be utilized, so long as they satisfy the requirement of controlling an AC line voltage of 120 V (although it can handle any AC line voltage up to 330 V) and a control DC voltage of 5 V. The relay 412 should only require a control current of 10 mA, well within the range provided by the transistor 410.

While the leak detector so far has been discussed in relation to embodiments associated with circulation or pumping systems, the leak detector can also be incorporated into battery embodiments housing liquid metal electrodes. For details on typical liquid metal batteries, see Hojong Kim, et. al., "Liquid Metal Batteries: Past, Present, and Future" Chem. Rev., v. 113, pp. 2075-2099 (2013), which is herein incorporated by reference.

Figure 6:
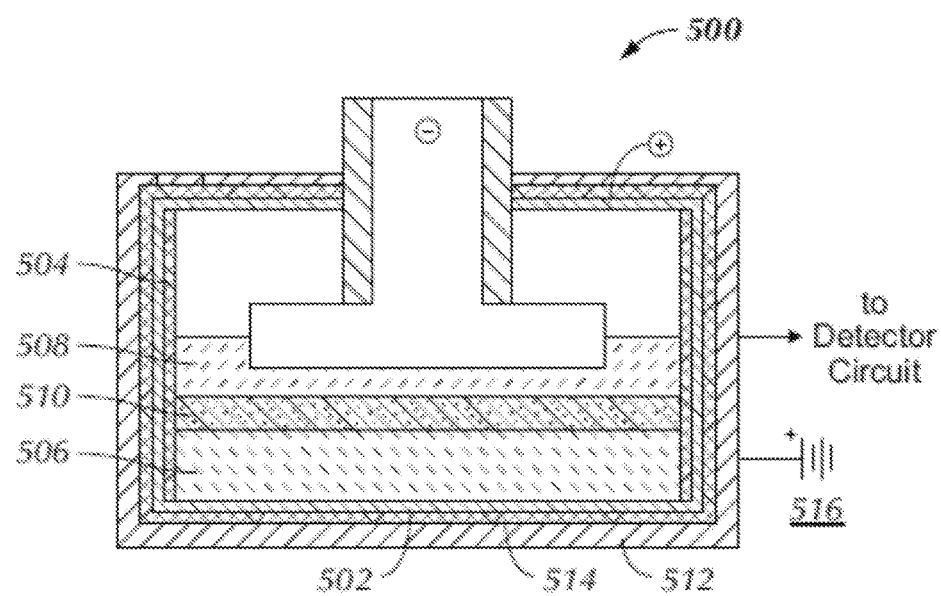
FIG. 6 is a diagram of a liquid metal battery utilizing a leak detector according to an embodiment of the present invention.

FIG. 6 is a diagram of a liquid metal battery 500 utilizing a leak detector according to an embodiment of the present invention. The battery 500 includes a battery housing 502 for containing chemical components of the battery, and an insulator 504 to separate the housing 502 from the chemical components. Any appropriate insulating material could be used for insulator 504 based on the battery chemistry and expected temperature range. For example, in one embodiment, yttria could be used with liquid lithium battery components. The battery also includes a positive electrode 506, a negative electrode 508, and an electrolyte 510. The positive or negative electrodes 506 and 508, or both, could be liquid metal. In one embodiment, the positive electrode 506 is Sb—Pb, the negative electrode 508 is Li, and the electrolyte 510 is a molten salt, though other chemicals may be utilized. Some typical liquid metals for battery use include but are not limited to Na, K, Cs, Mg, Ca, Zn, Cd, Hg, Al, Ga, Tl, Sn, Pb, Te, and others. In the battery 500, the risk of liquid metal leaks could occur anywhere around the battery housing 502. Therefore, a leak detector system will surround the battery via a conductive mesh or sheeting 512. In one embodiment, the conductive sheeting 512 is composed of copper, which also functions as a heat sink if not at the same temperature as the battery 500. However, other conductive materials may also be used for the conductive sheeting 512. The conductive sheeting 512 is also separated from the battery housing 502 by an insulator layer 514, which could be a glass sleeve or tape. The conductive sheeting 512 is placed at an electric potential greater than the battery housing 502 through a voltage source 516. In the event the battery 500 leaks liquid metal, the leak will close a circuit between the battery housing 502 and conductive sheeting 512, allowing current to flow. This serves as an the liquid metal switch described, for example, as either element 302 in FIG. 3 or 352 in FIG. 4. The leak detector circuit 300 or 350 described in FIG. 3 or 4 (or a similar circuit) would then send a digital signal to shut down external heating or isolate the leaking battery from charging/discharging circuitry. Multiple batteries could be connected together utilizing a AND gate (not shown) similar to the circuitry in FIG. 5, where the AND gate will output a high signal if all of its inputs are high (signaling no leaks) and will output a low signal if any of its inputs are low (signaling one or more batteries are leaking).

Figure 7:
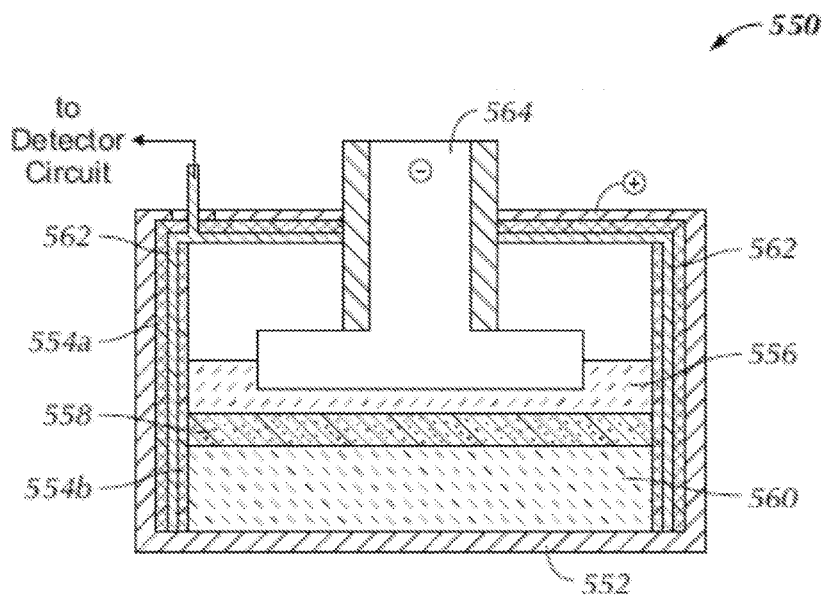
FIG. 7 is a diagram of a liquid metal battery utilizing a leak detector pertaining to internal leaks according to an embodiment of the present invention.

FIG. 7 illustrates an alternative embodiment where the leak detector system could protect a battery 550 from an internal short by placing conductive sheeting 562 and an outer insulator layer 554a between battery housing 552 and inner insulator layer 554b. The battery 550 includes a negative electrode 556, positive electrode 560, and electrolyte 558. The battery housing 552 also acts as a positive electrode conductor and the battery 550 further includes a negative electrode conductor 564. If a liquid metal leak occurs in the inner insulator 554b, then the conductive sheeting 562 will complete a circuit which acts as a liquid metal switch described, for example, as either element 302 in FIG. 3 or 352 in FIG. 4. An intermediate detector within the battery housing 552 is advantageous to shut down the battery, thus preventing internal short-circuiting and uncontrollable discharging of the battery 550. Another embodiment may utilize both internal and external protection by incorporating a conductive sheeting 562 within the battery housing 502 and an additional conductive sheeting 512 around the battery housing 502.

Figure 8:
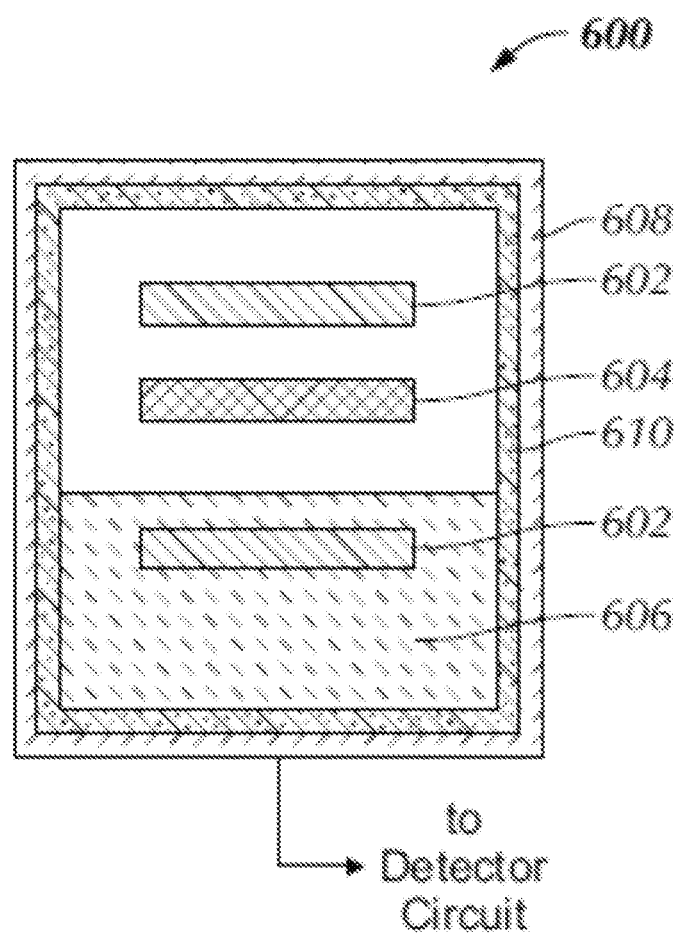
FIG. 8 is a diagram of a high power switch utilizing a leak detector according to an embodiment of the present invention.

In addition to pumping systems and batteries, the leak detector systems can also be incorporated into high power switches. FIG. 8 is a diagram of a high power switch 600 utilizing a leak detector according to an embodiment of the present invention. In one embodiment, the high power switch 600 is a vacuum-tube switch, though other embodiments may utilize other high power switches such as but not limited to ignitron type switches. The high power switch 600 includes electrodes 602 and a control grid 604 between the electrodes 602. Liquid metal 606 surrounds one of the electrodes 602 in order to prolong the life of the electrode and survive large power densities. In other embodiments, liquid metal 606 may surround both electrodes 602.

Loss of the liquid metal 606 due to a leak could result in damaging the electrodes 602. Thus, a leak detector system will surround the power switch 600 via a conductive mesh or sheeting 608. In one embodiment, the conductive sheeting 608 is composed of copper, but other conductive materials may also be utilized. The conductive sheeting 608 is separated from the power switch 600 by an insulator layer 610. The voltage of the conductive sheeting 608 will usually be at ground or another suitable reference. In event of a liquid metal leak, the voltage will change to match the electrode 602 to prevent damage. Further, the liquid metal leak will close a circuit between the power switch 600 and conductive sheeting 608, allowing current to flow. This serves as the liquid metal switch described, for example, as either element 302 in FIG. 3 or 352 in FIG. 4. The leak detector circuit 300 or 350 described in FIG. 3 or 4 (or a similar circuit) would then send a digital signal to shut down external heating or isolate the leaking power switch. Multiple power switches could also be connected together utilizing a AND gate (not shown) similar to the circuitry in FIG. 5, where the AND gate will output a high signal if all of its inputs are high (signaling no leaks) and will output a low signal if any of its inputs are low (signaling one or more power switches are leaking).

It is understood that the above-described embodiments are only illustrative of the application of the principles of the present invention and may be combined into a single embodiment without departing from the spirit and object of the present invention. Further, the present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims. Further, it is contemplated that an embodiment may be limited to consist of or to consist essentially of one or more of the features, functions, structures, methods described herein.

What is claimed is:

1. A liquid metal leak detector system, comprising:
   a. a direct current (DC) power supply;
   b. a plurality of analog to digital converters connected to the DC power supply, each converter comprising:
      i. a liquid metal switch, wherein the liquid metal switch is closed in event of a liquid metal leak, the leak causing electrical continuity between a conductive sheeting and housing for liquid metal; and
      ii. a comparator connected to the liquid metal switch for converting an analog signal into a digital signal, wherein the digital signal is configured such that a high signal constitutes no leak and a low signal constitutes a leak; and
   c. an AND gate connected to each of the plurality of converters for combining all of the digital signals output from the converters, the AND gate configured such that the AND gate outputs a high signal if all of its inputs are high and a low signal if any input is low.

2. The system of claim 1, further comprising a mechanical relay configured to receive a high or low signal from the AND gate, wherein receiving a low signal indicates to solidify the liquid metal.

3. The system of claim 2, further comprising a transistor and solid state relay connected between the AND gate and mechanical relay.

4. The system of claim 2, wherein the liquid metal is solidified by the mechanical relay opening a switch to shut off liquid metal heaters.

5. The system of claim 2, wherein the liquid metal is solidified by the mechanical relay opening a switch to shut off liquid metal pumps.

6. The system of claim 2, further comprising a manual shut-off, wherein the mechanical relay receives a manual signal to solidify the liquid metal.

7. The system of claim 1, wherein the liquid metal is lithium.

8. The system of claim 1, wherein the plurality of analog to digital converters each further comprise a light emitting diode (LED) to light up in event of a liquid metal leak.

9. The system of claim 1, wherein the plurality of analog to digital converters each further comprise a speaker to sound an alarm in event of a liquid metal leak.

10. The system of claim 1, wherein the plurality of analog to digital converters each further comprise a low pass filter.

11. The system of claim 1, wherein the plurality of analog to digital converters each further comprise a Zener diode and resistor.

12. A method of assembling a liquid metal leak detector, comprising:
   a. coupling a direct current (DC) power supply to a plurality of analog to digital converters, each converter comprising:
      i. a liquid metal switch, wherein the liquid metal switch is closed in event of a leak, the leak causing electrical continuity between a conductive sheeting and housing for the liquid metal; and
  ii. a comparator connected to the liquid metal switch for converting an analog signal into a digital signal, wherein the digital signal is configured such that a high signal constitutes no leak and a low signal constitutes a leak; and
 b. coupling an AND gate to each of the plurality of converters for combining all of the digital signals output from the converters, the AND gate configured such that the AND gate outputs a high signal if all of its inputs are high and a low signal if any input is low.

13. The method of claim 12, wherein the liquid metal is lithium.

14. The system of claim 12, wherein the plurality of analog to digital converters each further comprise a light emitting diode (LED) to light up in event of a liquid metal leak.

15. A circulation system for liquid metal, comprising:
 a. a plurality of pipe and/or valve connections, each connection constructed to connect two or more pipe segments of the circulation system, wherein liquid metal passes through the pipe segments;
 b. an insulator layer around each connection of the plurality of connections;
 c. a conductive sheeting around each insulator layer;
 d. a leak detector circuit attached to each connection via the conductive sheeting, the leak detector circuit comprising:
  i. a direct current (DC) power supply;
  ii. an analog to digital converter connected to the DC power supply comprising:
   1. a liquid metal switch, wherein the liquid metal switch is closed in event of a leak, the leak causing electrical continuity between the conductive sheeting and the pipe and/or valve connection; and
   2. a comparator connected to the liquid metal switch for converting an analog signal into a digital signal, wherein the digital signal is configured such that a high signal constitutes no leak and a low signal constitutes a leak;
 e. an AND gate connected to each of the plurality of leak detector circuits for combining all of the digital signals output from the converters, the AND gate configured such that the AND gate outputs a high signal if all of its inputs are high and a low signal if any input is low; and
 f. a mechanical relay configured to receive a high or low signal from the AND gate, wherein receiving a low signal indicates to solidify the liquid metal by the opening a switch which shuts off liquid metal heaters.

16. The system of claim 15, further comprising a transistor and solid state relay connected between the AND gate and mechanical relay.

17. The system of claim 15, wherein the mechanical relay is further configured to shut off liquid metal pumps.

18. The system of claim 15, wherein the liquid metal is lithium.

19. The system of claim 15, further comprising a manual shut-off, wherein the mechanical relay receives a manual signal to solidify the liquid metal.

20. The system of claim 15, wherein the analog to digital converter further comprises a light emitting diode (LED) to light up in event of a liquid metal leak.

21. The system of claim 15, wherein the analog to digital converter further comprises a speaker to sound an alarm in event of a liquid metal leak.

22. A leak detector system for liquid metal batteries, comprising:
 a. a liquid metal battery, comprising:
  i. a positive electrode, a negative electrode, and an electrolyte, wherein at least one electrode comprises a liquid metal;
  ii. a battery housing to enclose the electrodes and electrolyte;
  iii. an insulator layer around the battery housing; and
  iv. a conductive sheeting around the insulator layer; and
 b. a leak detector circuit attached to the conductive sheeting, the leak detector circuit comprising:
  i. a direct current (DC) power supply;
  ii. a plurality of analog to digital converters connected to the DC power supply, each converter comprising:
   1. a liquid metal switch, wherein the liquid metal switch is closed in event of a leak, the leak causing electrical continuity between the conductive sheeting and battery housing; and
   2. a comparator connected to the liquid metal switch for converting an analog signal into a digital signal, wherein the digital signal is configured such that a high signal constitutes no leak and a low signal constitutes a leak; and
  iii. an AND gate connected to each of the plurality of converters for combining all of the digital signals output from the converters, the AND gate configured such that the AND gate outputs a high signal if all of its inputs are high and a low signal if any input is low.

23. The system of claim 22, wherein the liquid metal is lithium, lead, antimony, and/or alloys of these liquid metals.

24. The system of claim 22, wherein the insulator layer and conductive sheeting surround the electrodes and electrolytes within the battery housing.

25. A leak detector system for high power switches, comprising:
 a. a high power switch, comprising:
  i. two electrodes and a control grid between the electrodes;
  ii. liquid metal surrounding at least one of the electrodes;
  iii. a power switch housing to enclose the electrodes and control grid;
  iv. an insulator layer around the power switch housing; and
  v. a conductive sheeting around the insulator layer; and
 b. a leak detector circuit attached to the conductive sheeting, the leak detector circuit comprising:
  i. a direct current (DC) power supply;
  ii. a plurality of analog to digital converters connected to the DC power supply, each converter comprising:
   1. a liquid metal switch, wherein the liquid metal switch is closed in event of a leak, the leak causing electrical continuity between the conductive sheeting and electrode surrounded by liquid metal; and
   2. a comparator connected to the liquid metal switch for converting an analog signal into a digital signal, wherein the digital signal is configured such that a high signal constitutes no leak and a low signal constitutes a leak; and
  iii. an AND gate connected to each of the plurality of converters for combining all of the digital signals output from the converters, the AND gate configured such that the AND gate outputs a high signal if all of its inputs are high and a low signal if any input is low.

26. The leak detector system of claim 25, wherein the high power switch is a vacuum-tube switch or ignitron type switch.

27. The leak detector system of claim 25, wherein the liquid metal is lithium or gallium.

* * * * *